United States Patent
Seh

(10) Patent No.: US 7,644,328 B2
(45) Date of Patent: Jan. 5, 2010

(54) SHARING ROUTING OF A TEST SIGNAL WITH AN ALTERNATIVE POWER SUPPLY TO COMBINATORIAL LOGIC FOR LOW POWER DESIGN

(75) Inventor: Soon Seng Seh, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 11/726,765

(22) Filed: Mar. 22, 2007

(65) Prior Publication Data
US 2008/0250280 A1    Oct. 9, 2008

(51) Int. Cl.
G01R 31/28    (2006.01)
H03K 3/289    (2006.01)

(52) U.S. Cl. ...................... 714/726; 327/202
(58) Field of Classification Search ................ 714/724, 714/726; 327/202
See application file for complete search history.

(56) References Cited

U.S. PATENT DOCUMENTS

| 5,157,781 | A | | 10/1992 | Harwood et al. | |
|---|---|---|---|---|---|
| 5,621,340 | A | * | 4/1997 | Lee et al. | 327/65 |
| 5,675,540 | A | | 10/1997 | Roohparvar | |
| 6,052,006 | A | * | 4/2000 | Talaga et al. | 327/143 |
| 6,437,623 | B1 | * | 8/2002 | Hsu et al. | 327/202 |
| 6,744,291 | B2 | * | 6/2004 | Payne et al. | 327/143 |
| 6,762,617 | B2 | | 7/2004 | Iwase et al. | |
| 6,965,261 | B2 | * | 11/2005 | Tran et al. | 327/202 |
| 7,154,317 | B2 | * | 12/2006 | Flynn et al. | 327/202 |
| 7,227,383 | B2 | * | 6/2007 | Hoberman et al. | 326/93 |
| 7,332,949 | B2 | * | 2/2008 | Kim | 327/202 |
| 2003/0188241 | A1 | * | 10/2003 | Zyuban et al. | 714/726 |
| 2006/0220700 | A1 | * | 10/2006 | Hoover et al. | 327/108 |

OTHER PUBLICATIONS

International Search Report/Written Opinion for PCT U.S. Appl. No. PCT/US2008/057529, mailed Aug. 14, 2008, 10 pages.

* cited by examiner

*Primary Examiner*—James C Kerveros
(74) *Attorney, Agent, or Firm*—Caven & Aghevli LLC

(57) ABSTRACT

A device shares an existing test signal routing trace with an alternative power supply delivery channel to portions of registers located in combinatorial logic sections.

19 Claims, 3 Drawing Sheets ized as the invention is particularly
SHARING ROUTING OF A TEST SIGNAL WITH AN ALTERNATIVE POWER SUPPLY TO COMBINATORIAL LOGIC FOR LOW POWER DESIGN Due to the high degree of miniaturization possible today in semiconductor technology, the complexity of designs has increased dramatically. To accompany the technological complexity increases, process scaling has been used to reduce the area needed for implementing logic functions in an effort to lower the product costs. Process scaling continues, but to prolong battery life in portable computers and hand held wireless communication devices, low power modes and techniques have been incorporated into the processors. There is a continuing need for better ways to provide flexibility for operating a processor or other digital circuits while preserving low power operation and the stability of any embedded devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
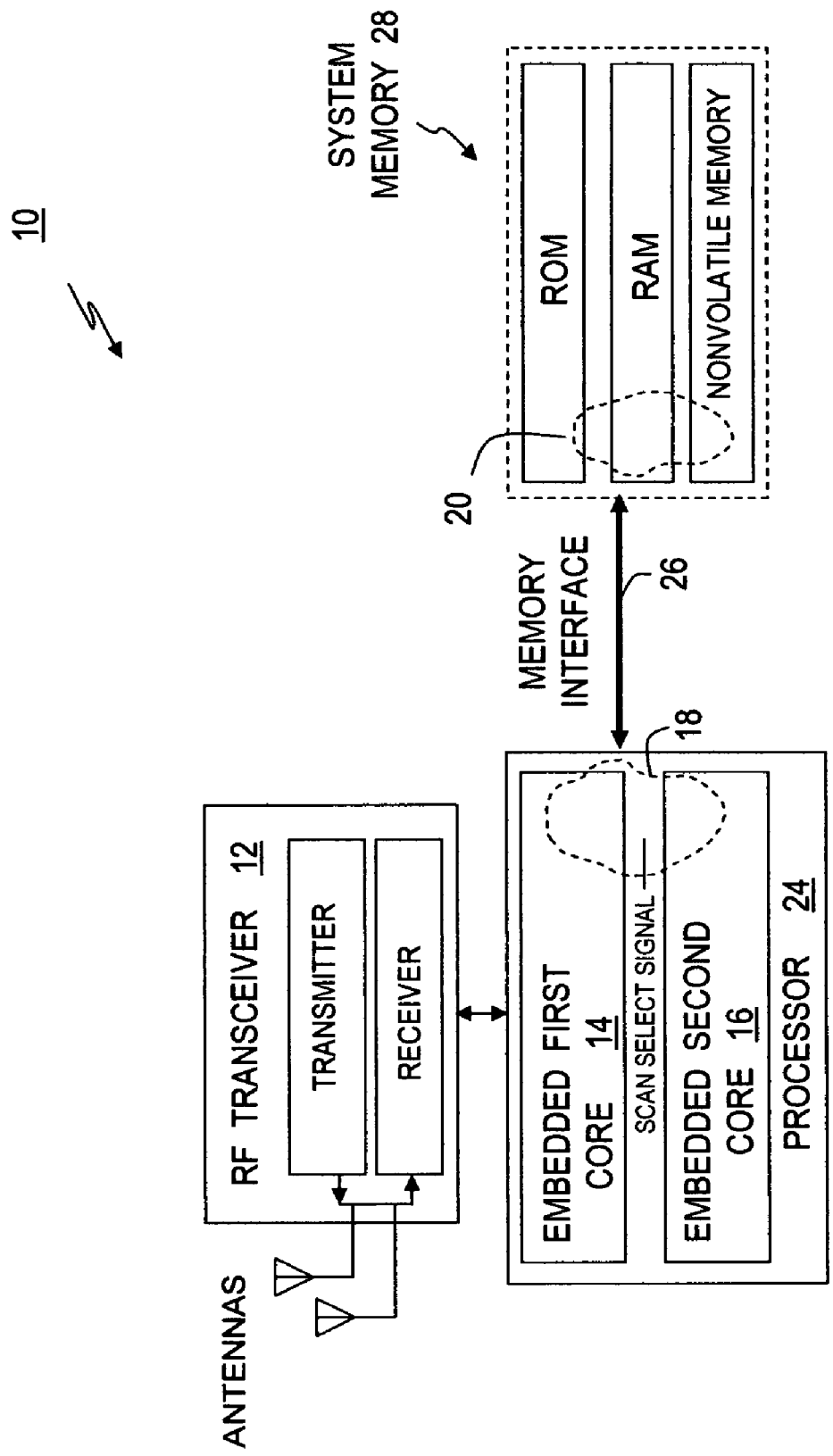
FIG. 1 is a diagram of a wireless device that implements sharing of an existing test signal routing trace with an alternative power supply delivered to registers in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The embodiment illustrated in FIG. 1 shows a wireless communications device 10 that may include one or more radios to allow communication with other over-the-air communication devices. Although the embodiment illustrates the coupling of antenna(s) to a transceiver 12 to accommodate modulation and demodulation, it should be noted that the present invention is not limited to wireless applications and may be used in a variety of products. For instance, the claimed subject matter may be incorporated into desktop computers, laptops, smart phones, MP3 players, cameras, communicators and Personal Digital Assistants (PDAs), medical or biotech equipment, automotive safety and protective equipment, automotive infotainment products, etc. However, it should be understood that the scope of the present invention is not limited to these examples.

In general, the illustrated embodiment shows an analog front end transceiver 12 that may be a stand-alone Radio Frequency (RF) discrete device. Alternatively, transceiver 12 may be embedded with a processor as a mixed-mode integrated circuit where the processor processes functions that fetch instructions, generate decodes, find operands, and perform appropriate actions, then stores results. The processor may include baseband and applications processing functions and utilize one or more processor cores 20 and 22 to handle application functions and allow processing workloads to be shared across the cores. The processor may transfer data through an interface 26 to memory storage in a system memory 28.

FIG. 1 further illustrates circuitry 18 and 20 in processor 24 and in system memory 28 that includes combinatorial logic. In processor 24 and the components of system memory 28, a low impedance metal network (not shown) provides a main power supply to the various functional blocks embedded throughout. The main power supply also supplies power to the combinatorial logic circuitry 18 and 20, but in accordance with the present invention the power provided from that main power supply may be shut off and an alternative power supply used to sustain the data values of any registers.

Figure 2:
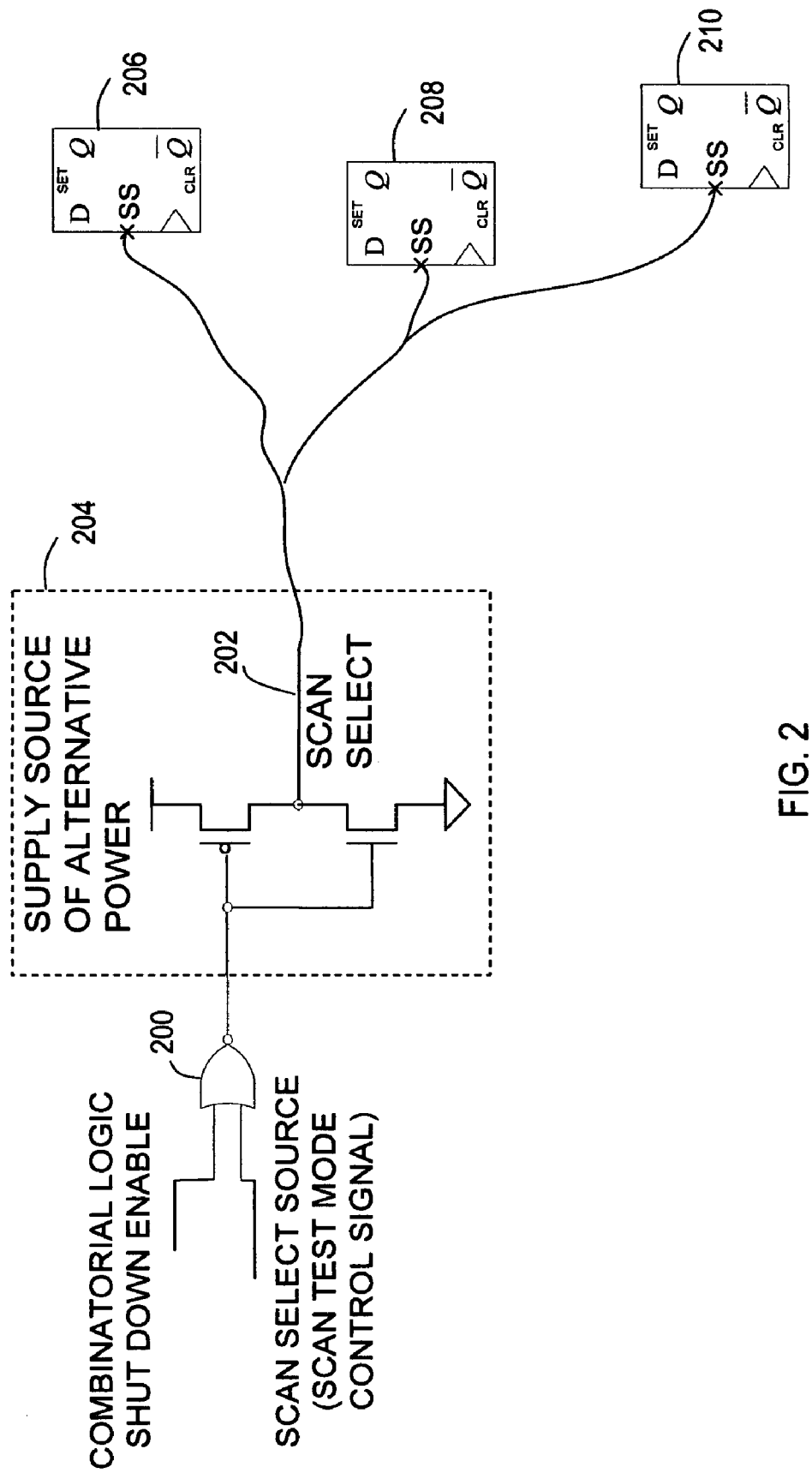
FIG. 2 is a diagram that illustrates a scan path as part of an existing test protocol that is enabled to also provide the alternative power supply to registers.

FIG. 2 illustrates a simplistic view of the combinatorial logic circuitry 18 and 20 previously presented in FIG. 1. In present devices, test circuitry has been included at the chip level to form a test protocol with access to the embedded circuitry for testing, debugging, providing in-system device programming and for diagnosing problems. Scan techniques have been used to eliminate the need for physical test points and reduce the time for in-circuit tests. In short, system testing has incorporated chip level test circuitry and techniques to allow programming steps into the test procedure.

Specifically, the figure shows a scan path 202 as part of an existing test protocol that provides a scan select signal as a test control signal to registers 206, 208 and 210, among other logic gates. Traditionally the scan select signal has been used in a test mode that is only active during production testing, and therefore, scan path 202 is inactive during operation of wireless communications device 10. In prior art devices that include a power savings mode, an independent power source has been utilized to power the registers when the combinatorial logic shuts down. The additional power routing provides the independent power source to the registers in order to retain data values during the power savings mode, but this independent power source increases the overall die size.

However, in accordance with embodiments of the present invention, scan path 202 may be used as an alternative power supply delivery channel during normal functional operation for wireless communications device 10. Thus, scan path 202 has a dual purpose, namely, to provide the scan select signal in a test mode and when not in a test mode, to deliver an alternative power potential to the registers to allow the main power potential to be shut off in a power savings mode. Note that logic gate 200 in combination with buffer 204 provides the dual purpose use for scan path 202. In particular, logic gate 200 and buffer 204 provide scan path 202 with the scan select signal in a test mode, but provide the alternative power potential when not in the test mode.

Figure 3:
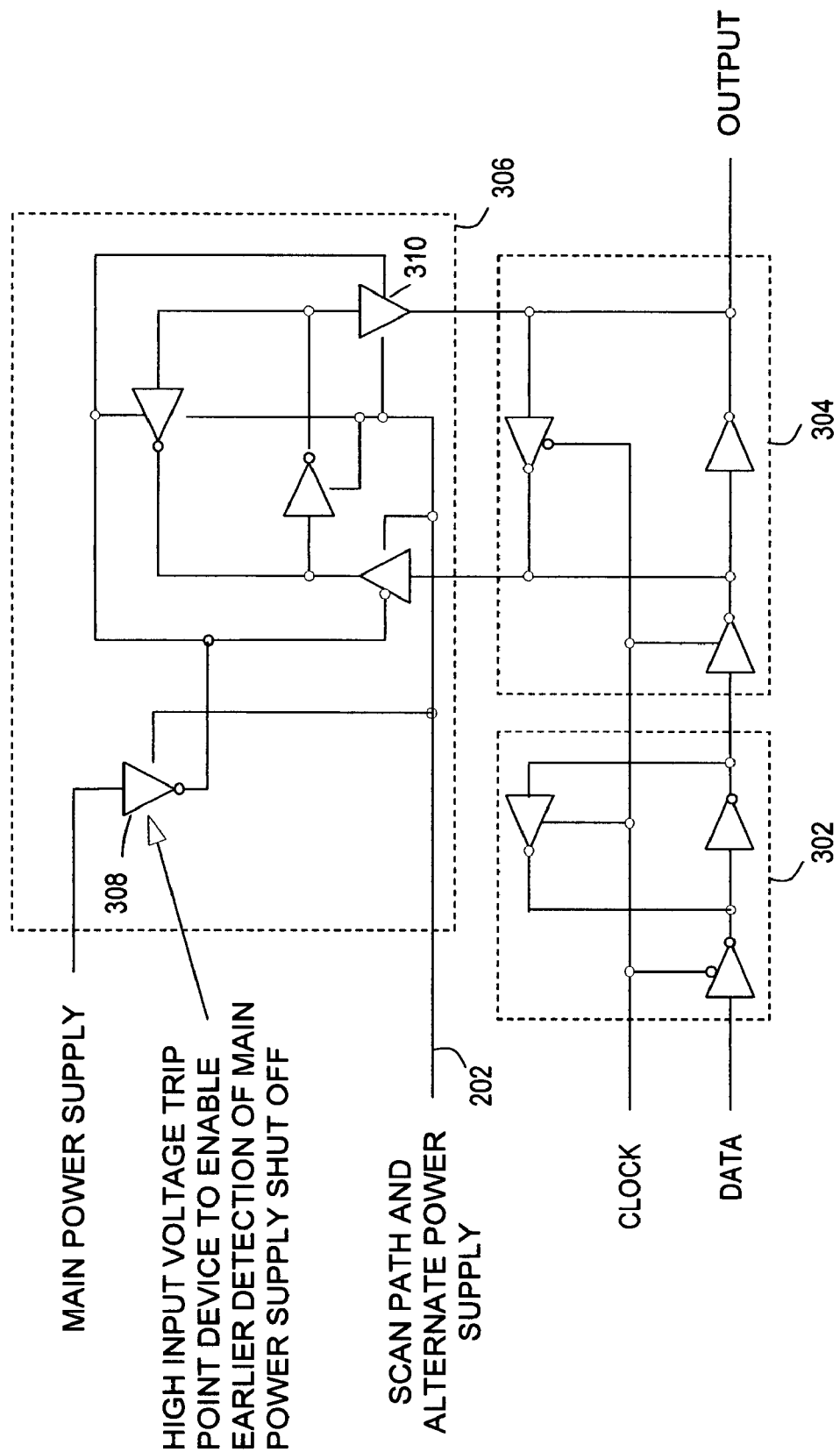
FIG. 3 illustrates the use of resource sharing of the scan path to provide an alternative power supply to the data retention portion of a register.

FIG. 3 is an embodiment that highlights a register having a master portion 302, a slave portion 304, and a data retention portion 306 that is used in a power savings mode. The register illustrates the use of resource sharing of scan path 202 to allow the alternative power supply delivery channel to provide power to the data retention portion 306 when wireless communications device 10 is not operating in the test mode. As already mentioned, scan path 202 delivers the original scan select signal in the test mode that selects the scan input of the registers for scan shifting, but highlighted in this figure is the use of scan path 202 to deliver the alternative power supply to the register when wireless communications device 10 is not operating in the test mode. Note that the inverters/buffers located in master portion 302 and slave portion 304 are powered by the main power supply, whereas the inverters/buffers located in data retention portion 306 are powered by the alternative power supply delivered by scan path 202.

In this embodiment the master portion 302 latches a value received at the DATA input in accordance with the CLOCK signal. The latched value from master portion 302 is passed to the slave portion 304 upon the appropriate transition of the CLOCK signal. Thus, the register is able to capture a DATA value in master portion 302 that is latched and stored in slave portion 304. When wireless communications device 10 enters the power savings mode, the main power supply to master portion 302 and slave portion 304 is switched off. Thus, in the power savings mode the inverters/buffers in master portion 302 and slave portion 304 are not powered. However, the data retention portion 306 is powered using the alternate power supply received on scan path 202 to retain the data value transferred from slave portion 304 upon entering the power savings mode. Upon exiting the power savings mode, data retention portion 306 restores the data value to the slave portion 304 of the register prior to switching on the main power supply to master portion 302 and slave portion 304.

The alternative power supply delivered to the combinatorial logic via scan path 202 allows the main power supply to shut down in the power savings mode to conserve power. The embodiment illustrated in the figure is an implementation choice for a retention logic design, but other latch circuits and retention logic circuits are anticipated. Scan path 202 is first turned on transitioning to a high potential to power up the retention portion 306. Data stored in slave portion 304 may be maintained in the slave portion until the main power is switched off. A high input voltage trip point inverter 308 detects that the main power supply is being shut off. The early detection of the main power supply being switched off by trip point inverter 308 enables earlier isolation of the power regimes, i.e., the alternate power supply found in data retention portion 306 from the main power supply found in master portion 302 and slave portion 304. Trip point inverter 308 also has a high input voltage trip point to enable late detection of the main power switching on to ensure that slave portion 304 is able to retain the data value from the data retention portion 306 before tri-stating buffer 310. Note that the proper sequence includes providing the alternative power supply to data retention portion 306 on scan path 202 prior to shutting off the main power supply to slave portion 304. Also, the alternative power supply is provided to data retention portion 306 until the main power is restored and able to sustain the data value in slave portion 304 (but before the main power reaches a normal operational voltage level).

By now it should be apparent that embodiments of the present invention allow the sharing of an existing test signal routing trace with an alternative power supply delivery to portions of the registers. Embodiments of the present invention allow silicon debugging by shifting the register value out in the middle of an operation, then resuming the operation after the scan shift operation.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed:

1. A circuit, comprising:
   a register coupled to a test signal routing trace, wherein the register is to receive a test signal, via the test signal routing trace, during a test mode and wherein the register is to receive an alternative power supply, via the test signal routing trace, during a low power mode,
   wherein the register is to comprise at least a first portion and a second portion and wherein one of the first or second portions is to be powered off during the low power mode and another one of the first or second portions is to be powered during the low power via the test signal routing trace.

2. The circuit of claim 1, wherein the register includes a master latch, a slave latch and a low power data retention latch.

3. The circuit of claim 2, wherein the master latch and the slave latch are powered from a main power supply that is switched off in the low power mode.

4. The circuit of claim 3, wherein the alternative power supply to the data retention latch on the test signal routing trace is provided prior to shutting off the main power supply to the slave latch.

5. The circuit of claim 3, wherein the low power data retention latch is powered from the alternative power supply on the test signal routing trace in the low power mode.

6. A circuit, comprising:
   a high input voltage trip point inverter having early and late detection to detect whether a main power supply is being shut off or turned on; and
   combinational logic, coupled to a test signal routing trace, wherein the combinational logic is to provide a test signal, via the test signal routing trace, during a test mode and wherein the combinational logic is to provide an alternative power supply to a register, via the test signal routing trace, in response to a detection by the high input voltage trip point inverter that the main power supply is being shut off,
   wherein the register is to comprise at least a first portion and a second portion and wherein one of the first or second portions is to be powered off while the main power supply is shut off and another one of the first or second portions is to be powered while the main power supply is shut off via the test signal routing trace.

7. The circuit of claim 6, wherein the register comprises a master/slave portion powered from a main power supply and a low power data retention portion coupled to the test signal routing trace to receive the alternative power supply.

8. The circuit of claim 7, wherein the master/slave portion of the register transfers a data value to the low power data retention portion when the high input voltage trip point inverter detects that the main power supply is being shut off or turned on.

9. The circuit of claim 8, wherein of the low power data retention portion of the register transfers the data value to the master/slave portion when the main power supply is restored.

10. The circuit of claim 7, wherein an output of the high input voltage trip point inverter is tri-stated to isolate the alternative power supply from the main power supply.

11. A wireless device having first and second processor cores, comprising:
   combinational logic located within the first processor core, wherein the combination logic is to comprise registers and logic gates, where a scan path is coupled to the combination logic to provide a select signal to a scan input of the registers for scan shifting; and wherein an alternative power potential is provided to the registers via the scan path, wherein at least one of the registers is to comprise at least a first portion and a second portion and wherein one of the first or second portions is to be powered off during the low power mode and another one of the first or second portions is to be powered during the low power mode via the scan input.

12. The wireless device of claim 11 wherein at least one of the registers in the combinational logic includes a master/slave portion powered from a main power potential and wherein the at lest one of the registers comprises a low power data retention portion coupled to the scan path to receive the alternative power potential.

13. The wireless device of claim 12 wherein the master/slave portion of the register transfers a data value to the low power data retention portion when the trip point inverter detects that the main power potential is being shut off.

14. The circuit of claim 12, wherein of the low power data retention portion of the register transfers the data value to the master/slave portion when the main power potential is being restored.

15. A method of sharing a scan path for dual purpose, comprising:

providing a select signal to a scan input of a register for scan shifting during a test mode, wherein the select signal is provided via a scan path coupled to the scan input of the register; and providing an alternative power potential to the register via the scan path when the register is not operating in the test mode, wherein the register is to comprise at least a first portion and a second portion and wherein one of the first or second portions is to be powered off during the low power mode and another one of the first or second portions is to be powered during the low power mode via the scan path.

16. The method of claim 15, further comprising:

powering a master/slave portion of the register from a main power potential; and powering a low power data retention portion of the register from the alternative power potential supplied via the scan path.

17. The method of claim 16, further comprising:

using a trip point inverter to detect that the main power potential supplied to the register is being shut off and enable the alternative power potential to the register using the scan path.

18. The method of claim 17, further comprising:

transferring a data value from the master/slave portion of the register to the low power data retention portion when the trip point inverter detects that the main power potential is being shut off.

19. The method of claim 18, further comprising:

transferring the data value from the low power data retention portion of the register to the master/slave portion when the main power potential is restored.

* * * * *